United States Patent

[11] 3,569,865

[72] Inventor Daniel J. Healey, III
Baltimore, Md.

[21] Appl. No. 832,767
[22] Filed June 12, 1969
[45] Patented Mar. 9, 1971
[73] Assignee the United States of America as represented by the Secretary of the Navy

[54] HIGH STABILITY VOLTAGE-CONTROLLED CRYSTAL OSCILLATOR
4 Claims, 3 Drawing Figs.

[52] U.S. Cl. .......... 331/116, 331/159, 331/177, 332/30
[51] Int. Cl. .......... H03b 5/36
[50] Field of Search .......... 331/116, 158, 159, 177 (V); 332/30 (T)

[56] References Cited

UNITED STATES PATENTS

| | | | |
|---|---|---|---|
| 3,176,244 | 3/1965 | Newell et al. | 331/116 |
| 3,302,138 | 1/1967 | Brown et al. | 331/116X |
| 3,358,244 | 12/1967 | Ho et al. | 331/116 |
| 3,477,039 | 11/1969 | Chan | 331/116 |

*Primary Examiner*—Roy Lake
*Assistant Examiner*—Siegfried H. Grimm
*Attorneys*—Edgar J. Brower and H. H. Losche

ABSTRACT: A high stability voltage-controlled crystal oscillator having a series coupled emitter follower transistor amplifier with a regenerative feedback to a tuned circuit coupled to the base electrode of the amplifier, the tuned circuit having a narrow band-pass crystal filter in series with a variable capacity device and in parallel with a low Q inductance with a control voltage adapted to be coupled to the variable capacity device to vary the capacitive reactance of the tuned circuit to produce oscillations over a limited frequency range with high stability.

INVENTOR
DANIEL JOSEPH HEALEY III

BY H. H. Locke

ATTORNEY

HIGH STABILITY VOLTAGE-CONTROLLED CRYSTAL OSCILLATOR

BACKGROUND OF THE INVENTION

This invention relates to voltage-controlled oscillators and more particularly to crystal-controlled oscillators which can be frequency controlled over a limited frequency range through the use of variable capacity devices in the tuned circuit of the oscillator.

Voltage-controlled crystal oscillators are known in which a crystal and a varactor are used in the feedback path and tuned circuit of the oscillator amplifier with a control voltage applied to the varactor to vary the capacitive reactance of the tuned circuit input to the amplifier a sufficient amount to vary the frequency over a limited range. The crystal must operate as a crystal filter to hold the oscillations in a very narrow band of frequencies. The crystal employed must exhibit extremely low anharmonic spurious frequencies which requires the ratio of the resistance of the anharmonic resonances to the resistance of the crystal unit impedance at the desired frequencies of operation to exceed 40 decibels to preclude frequency jumps. This results in difficulty in manufacture of the crystal units and restricts the permissable range of crystal unit inductance thereby also restricting the impedance level of the tuning reactance which makes the entire circuit stability more susceptible to stray capacitance variation. If operation over a wide tuning range is attempted, it is discovered that owing to the high ratio of the resistance of the series tuning reactance to the resistive component of the crystal unit impedance the circuit Q of the entire tunable resonator becomes extremely small, e.g., 34 at 19.5 MHz. The stability is therefore determined primarily by the series tuning reactance and this stability is poor in these prior known devices.

SUMMARY OF THE INVENTION

In the present invention it was found that if a low Q inductor of 20 to 50 millihenrys is connected in parallel with the crystal unit to antiresonate the total static capacitance of the crystal unit, the impedance characteristic of the crystal unit and parallel inductance become resonant at a compatible resistance and reactance position. The resistive component of the crystal unit impedance increases to a resistance at the crystal unit resonance frequency and this resistance becomes a parabolic curve about a common line. This suggests tuning symmetrically about this common line requiring negligible change in gain of the sustaining circuit, as compared with other types of wideband tuning circuitry. By using low inductance crystal units having anharmonic resistance to main mode resistance in a ratio of only 2.5 to 1, a circuit Q between 2,500 and 3,000 can be obtained whereas in operation at other frequencies with a resistance ratio of 100 to 1 a circuit Q of only 2,000 to 2,500 may be obtained which restricts the allowable range of inductance values for the crystal unit to rather large values introducing difficulties with variation of stray capacitances in the circuit affecting long term stability. With low inductance crystals, on the other hand, the overall circuit is more stably reproduced. It is therefore a general object of this invention to provide a voltage-controlled crystal oscillator circuit with a low Q inductance in parallel with a low inductance crystal unit in the tuned circuit having voltage-controlled variable capacity devices therein to vary the capacitive reactance to provide stable oscillations over a limited frequency range.

BRIEF DESCRIPTION OF THE DRAWING

These and other objects and the attendant advantages, features, and uses will become more apparent to those skilled in the art as a more detailed description proceeds when considered along with the accompanying drawing in which.

DESCRIPTION OF THE PREFERRED EMBODIMENT

Figure 1:
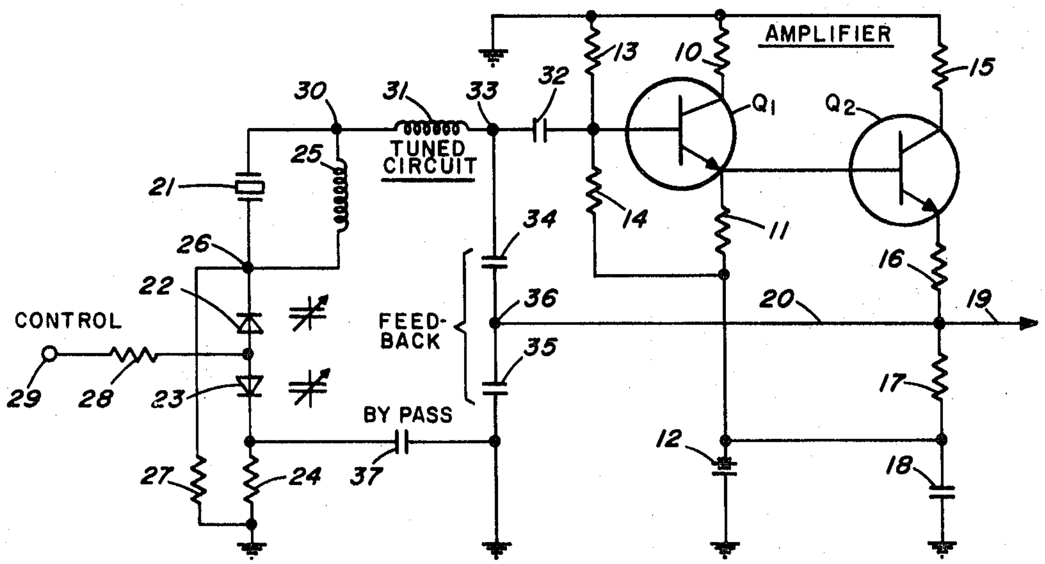
FIG. 1 is a circuit schematic of the voltage-controlled crystal oscillator.

Referring more particularly to FIG. 1 there is illustrated a circuit schematic of the voltage-controlled crystal oscillator (VCXO) having an amplifier utilizing a pair of transistors Q1 and Q2 with an emitter-to-base coupling therebetween. The collector of transistor Q1 is coupled through a load resistor 10 to a fixed potential such as ground while the emitter is coupled through a load resistor 11 to the negative terminal of a voltage source 12. The base of transistor Q1 is biased by a voltage divider consisting of resistors 13 and 14 across the voltage supply 12. The collector of transistor Q2 is coupled to the fixed potential through a load resistor 15 and its emitter is coupled through the resistors 16 and 17 to the negative terminal of the voltage source 12. A filtering capacitor 18 is coupled across the terminals of the battery or voltage source 12 to filter out alternating currents. The junction of the resistors 16 and 17 in the emitter circuit of Q2 is coupled to an output conductor 19. The junction of the resistors 16 and 17 also provide a feedback circuit by way of conductor 20.

A tuned circuit for the amplifier provides the resonant circuit for the VCXO. This tuned circuit consists of a low inductance crystal 21 in series with a pair of anode back-to-back variable capacitance diodes 22 and 23 having the cathode of diode 23 coupled through a high resistance 24 to the fixed potential. An inductance coil 25 is connected in parallel to the crystal 21, the terminal point 26 being coupled through a second high resistance element 27 to the fixed potential. The anode back-to-back coupling of the variable capacitance diodes 22 and 23 is coupled through a high resistance element 28 to an input terminal 29 to which may be applied a direct current control voltage to vary the capacitive reactance of the diodes 22 and 23, as shown by the variable capacitance symbols to the right of these diodes. The upper junction point 30 of the parallel circuit for the crystal 21 and inductance 25 is coupled in series through an inductance 31 and a coupling capacitor 32 to the base of the first transistor amplifier Q1. The point 33 of the inductance 31 and coupling capacitor 32 is coupled in series through capacitors 34 and 35 to the fixed potential, the junction point 36 between these two capacitors 34 and 35 being connected to the feedback conductor 20 of the amplifier. The cathode of the variable capacitance diode 23 is coupled through a bypass capacitor 37 to the fixed potential. The combination of the tuned circuit and the amplifier by the coupling capacitor 32 and through the regenerative feedback circuit 20 provide the VCXO for a limited range of oscillations adjustable through the control voltage applied to terminal 29 to vary the capacitive reactance of the diodes 22 and 23 producing these oscillations on the output conductor 19.

OPERATION

Figure 2:
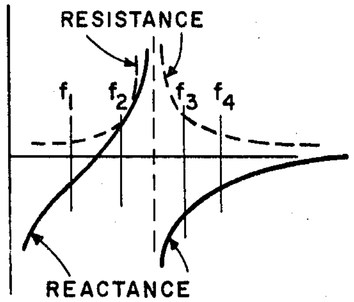
FIG. 2 is a graph of the resistance and reactance curves of a typical wideband voltage-controlled crystal oscillator.

In the operation of a typical wideband VCXO, oscillations ordinarily would occur between a frequency $f$ 3 and $f$ 4 as shown on the graph of the resistance and reactance curves in FIG. 2. A crystal filter is normally used to eliminate oscillations in the range of the frequencies $f$ 1 to $f$, 2 as shown in FIG. 2. Such crystal units employed for this purpose must exhibit extremely low anharmonic spurious frequency where the ratio of the resistance of the anharmonic resonances to the resistance of the crystal unit impedance at the desired frequencies of operation must exceed 40 decibels to preclude frequency jumps. Such crystal units are hard to manufacture and the restrictions on the permissible range of the crystal unit inductance thereby restricting the impedance level of the tuning reactance makes the entire circuit stability more susceptible to stray capacitance variation.

Figure 3:
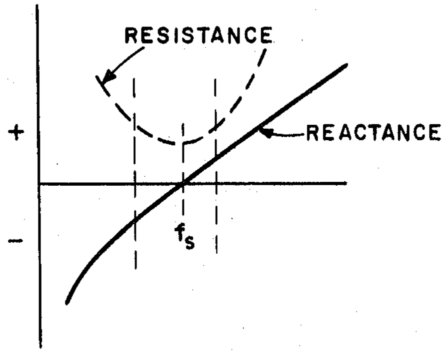
FIG. 3 is a graph of the resistance and reactance curves for the voltage control of the crystal oscillator of FIG. 1.

In the operation of the device shown in FIG. 1, with the inductance 25 in parallel with the low inductaNce crystal unit 21, the resistance and reactance relation of the tuned circuit is provided as shown in FIG. 3 providing a center frequency of $f_s$ around which the limited output frequency on the output conductor may be produced. Upon the application of voltage from the supply source 12 to the VCXO circuit, oscillations will occur on the output 19 in accordance with the resonance in the tuned circuit through the elements 21, 22, 23, 25, 31, 34, 35, and 37. The low Q inductor 25 in parallel with the crystal unit 21 will antiresonate the total static capacitance of the crystal unit 21 and provide high stability within the range of frequencies about $f_s$, as shown in FIG. 3. This small range of frequencies can be provided by controlling the direct current control voltage at the terminal 29 to vary the capacitive reactance of the diodes 22 and 23 thereby varying the resonance point of the tuned circuit connected to the amplifier to vary the output frequency on the output conductor 19. Accordingly, any stable control voltage applied to the terminal 29 will provide a certain output frequency and it will be stable at that frequency until changed by control voltage at 29. Any spurious voltages applied to the diodes 22 and 23 will be bypassed to ground through 37. Accordingly a VCXO of high stability is provided in this circuit for use in circuits where such high stability is required, as in radar sets where a limited range of voltage oscillations are necessary and these oscillations at any adjusted position are required to be stable.

While many modifications may be realized in the above description for the VCXO to meet desired conditions, it is to be understood that I desire to be limited in the spirit of my invention only by the scope of the appended claims.

I claim

1. A high stability voltage-controlled crystal oscillator comprising:

an amplifier having an input and an output;

a tuned circuit coupled to said amplifier input with a crystal unit and a pair of variable capacitance diodes in anode back-to-back relation in series with said input with the cathode of one coupled to said crystal unit, the cathode of the other coupled through a first high resistance to a fixed potential, and a control voltage coupled to said common back-to-back coupling of said pair of variable capacitance diodes through a second high resistance to vary the capacitive reactance of said pair of variable capacitance diodes, and a low Q first inductance in parallel with said crystal unit; and a feedback circuit from the output of said amplifier to said tuned circuit to regeneratively sustain oscillations on the output of said amplifier produced by the time constant established in said tuned circuit whereby said crystal unit and parallel inductance thereto establish an anharmonic resistance and reactance relationship to produce a stable output frequency variable within limits produced by varying the capacitive reactance of said pair of variable capacitance diodes.

2. A high stability voltage-controlled crystal oscillator as set forth in claim 1 wherein said tuned circuit includes a second inductance, first, second, and third capacitors in series, this series being in parallel to the series coupling of said crystal and variable capacity diodes, said feedback from the output of said amplifier being coupled to the junction of said first and second capacitors and a fixed potential coupled to the junction of said second and third capacitors.

3. A high stability voltage-controlled crystal oscillator as set forth in claim 2 wherein said amplifier consists of a pair of emitter-to-base coupled transistors, said tuned circuit being coupled to the base of the first transistor and said output being coupled through an output resistor from the emitter of the second transistor.

4. A high stability voltage controlled crystal oscillator as set forth in claim 3 wherein said tuned circuit includes a third high resistance in parallel with said pair of variable capacitance diodes and said first large resistance.